(12) United States Patent
Abe et al.

(10) Patent No.: US 7,936,071 B2
(45) Date of Patent: May 3, 2011

(54) SEMICONDUCTOR DEVICE HAVING A SPECIFIED TERMINAL LAYOUT PATTERN

(75) Inventors: Masaaki Abe, Chino (JP); Kazuhiro Kijima, Kawaguchi (JP)

(73) Assignee: Seiko Epson Corporation (JP)

( * ) Notice: Subject to any disclaimer, the term of this patent is extended or adjusted under 35 U.S.C. 154(b) by 134 days.

(21) Appl. No.: 11/945,498

(22) Filed: Nov. 27, 2007

(65) Prior Publication Data

US 2008/0088024 A1  Apr. 17, 2008

Related U.S. Application Data

(62) Division of application No. 11/141,270, filed on May 31, 2005, now abandoned.

(30) Foreign Application Priority Data

Jun. 1, 2004  (JP) ................................. 2004-163010

(51) Int. Cl.
*H01L 29/41* (2006.01)

(52) U.S. Cl. ......... 257/773; 257/E23.019; 257/E23.142; 257/E23.145; 257/E23.151; 257/E21.575; 257/E21.627; 438/129

(58) Field of Classification Search .................. 257/748, 257/750, 752, 758, E21.669, E27.102, 306, 257/310–312, 774, E21.008, E21.582, E21.649, 257/295, 714, 773, 775, 786, E23.02, E23.019, 257/E23.142, E23.145, E23.151, E21.575, E21.627; 438/253, 396, 129

See application file for complete search history.

(56) References Cited

U.S. PATENT DOCUMENTS

| | | | |
|---|---|---|---|
| 5,106,461 A | 4/1992 | Volfson et al. | |
| 5,751,065 A | 5/1998 | Chittipeddi et al. | |
| 6,316,801 B1 | 11/2001 | Amanuma | |
| 6,417,530 B1 * | 7/2002 | Jung | 257/202 |
| 6,765,773 B2 | 7/2004 | Reiner | |
| 2002/0000579 A1 * | 1/2002 | Aoyama | 257/211 |
| 2004/0135256 A1 * | 7/2004 | Takahashi et al. | 257/758 |

FOREIGN PATENT DOCUMENTS

| | | |
|---|---|---|
| JP | 09-283525 | 10/1997 |
| JP | 2002-198374 | 7/2002 |
| JP | 2003-124336 | 4/2003 |

* cited by examiner

*Primary Examiner* — Benjamin P Sandvik
*Assistant Examiner* — Christopher M Roland
(74) *Attorney, Agent, or Firm* — Harness, Dickey & Pierce, P.L.C.

(57) ABSTRACT

A semiconductor device comprises a semiconductor substrate that is provided with an integrated circuit; a multi-layered member that is installed in the semiconductor substrate, including a plurality of conductive members and an insulation member; and an external terminal formed on a part of the surface of the multi-layered member. A pair of the conductive members contacts with the upper surface and the lower surface of the insulation member directly under the external terminal, includes a portion where the conductive members are overlapped each other, and are electrically coupled to each other.

7 Claims, 3 Drawing Sheets

SEMICONDUCTOR DEVICE HAVING A SPECIFIED TERMINAL LAYOUT PATTERN

RELATED APPLICATIONS

This application is a divisional of U.S. patent application Ser. No. 11/141,270 filed May 31, 2005. This application claims the benefit of Japanese Patent Application No. 2004-163010 filed Jun. 1, 2004. The disclosures of the above applications are incorporated herein by reference.

BACKGROUND

1. Technical Field

The present invention relates a semiconductor device.

2. Related Art

A semiconductor device includes multi-layered structure including an electrical conductor and an insulation member. An insulation member prevents electrical conduction among conductors having different potentials, being required as holding the insulation property, but it is difficult to attain it by the conventional technology.

The present invention is intended to prevent electrical conduction among conductors having different potentials.

SUMMARY

A semiconductor device of the present invention comprises: a semiconductor substrate that is provided with an integrated circuit; a multi-layered member that is formed on the semiconductor substrate, including a plurality of conductive members and an insulation member; an external terminal formed on a part of the surface of the multi-layered member.

A pair of the conductive members contacts with the upper surface and the lower surface of the insulation member directly under the external terminal; includes a portion where the conductive members are overlapped each other; and are electrically coupled to each other.

According to the invention, there is no substantial problem even if overlapped portions of a pair of conductive members are electrically conducted since they are originally conducted.

A semiconductor device of the present invention comprises: a semiconductor substrate that is provided with an integrated circuit; an multi-layered member that is formed on the semiconductor substrate, including a plurality of conductive members and an insulation member; an external terminal formed on surface of the multi-layered member.

A pair of the conductive members contacts with the upper surface and the lower surface of the insulation member directly under the external terminal; is electrically disconnected from each other; and not overlapping each other directly under the external terminal. According to the invention, a pair of the conductive members is not overlapping each other and is uneasy to be conducted with each other.

In the semiconductor device, the integrated circuit may include a switching element that turns the pair of conductive members off electrically, and a part of the switching element or all of it may be located directly under the external terminal.

In the semiconductor device, the external terminal may be located on the top layer of the conductive members and electrically connected and the top layer of the conductive members may be formed as smaller than a projected area of the external terminal toward the multi-layered member.

DETAILED DESCRIPTION

Embodiments of the invention will now be described with reference to the accompanying drawings.

Figure 1:
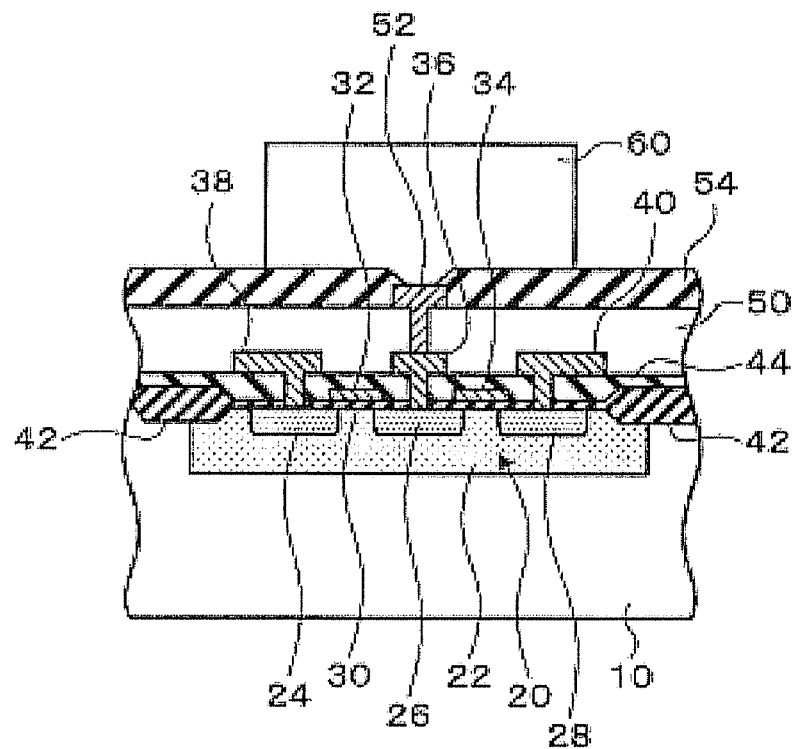
FIG. 1 is a cross sectional view of a part of a semiconductor device of the embodiment.
Figure 2:
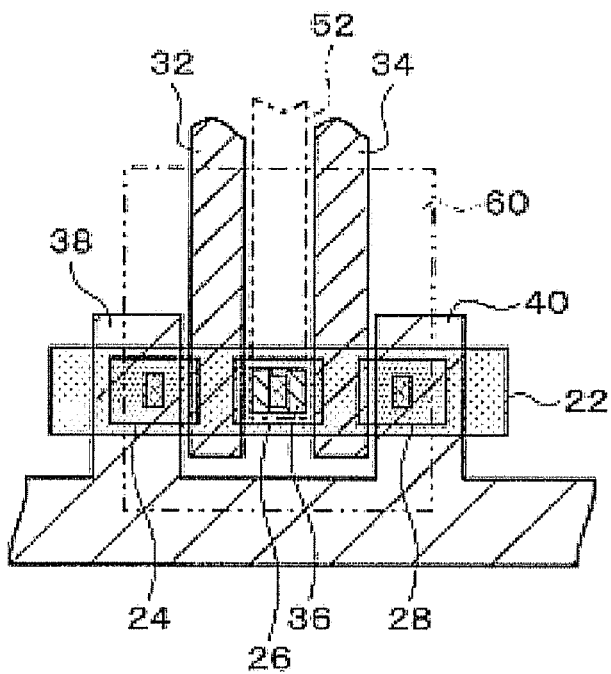
FIG. 2 is a plan view of a part of a semiconductor device of the embodiment.

FIG. 1 shows a cross section of a part of a semiconductor device of the embodiment of the invention and FIG. 2 is a plan view showing a part of the semiconductor device of the embodiment of the invention.

A semiconductor device includes a semiconductor substrate 10 such as silicon substrate. The semiconductor substrate 10 may be a semiconductor-crystallized substrate. The semiconductor substrate 10 includes doped impurities and shows N-type or P-type. The semiconductor substrate 10 may be a semiconductor chip or a wafer. A semiconductor wafer is cut by dicing or scribing to obtain a semiconductor chip.

Figure 5:
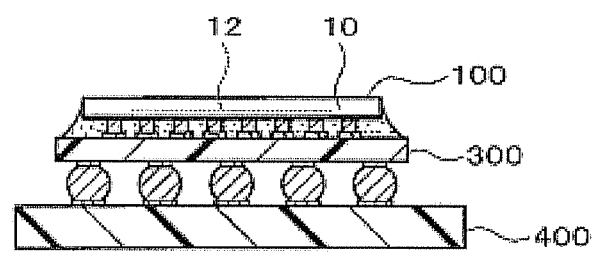
FIG. 5 shows a semiconductor package device including a substrate in which a semiconductor device of the embodiment is mounted.

An integrated circuit 12 shown in FIG. 5 is formed on the semiconductor substrate 10. The integrated circuit 12, which is a monolithic integrated circuit for attaining semiconductor functions, is formed in a semiconductor chip of a semiconductor wafer. The semiconductor circuit 12 may include a switching element 20 shown in FIG. 1. The switching element 20 may be a part of a protective circuit such as electrostatic shielding circuit or an output driver.

In the present embodiment, the switching element 20 is a metal oxide semiconductor field effect transistor (MOSFET). The semiconductor substrate 10 is provided with a well 22 to form the MOSFET. The well 22 shows inversed conductivity against that of the substrate 10. A plurality of diffused regions 24, 26 and 28 is formed with a specific distance in the well 22. The diffused regions 24, 26 and 28 are impurity-doped regions. These impurities are doped by thermal diffusion method or ion implantation region. FIG. 1 shows that a pair of diffused regions 24 and 28 is located as a source region adjacent to the both sides of diffused region 26 as a drain region. The diffused regions 24, 26 and 28 show inversed conductivity against that of the well 22. An insulation film 30 such as silicon oxide layer is formed on the well 22.

An electrode 32 called as a gate electrode is formed above the diffused regions 24 and 26 adjacent each other on the insulation film 30. An electrode 34 called as a gate electrode is formed above the diffused regions 26 and 28 adjacent each other on the insulation film 30. The electrodes 32 and 34 are electrically insulated from the diffused regions 24, 26 and 28 via the insulation film 30. The electrodes 32 and 34 are electrically connected to each other, not shown in the figure. The electrodes 32 and 34 are electrically connected to the other elements of the integrated circuit 12 via an outgoing line as shown in FIG. 2. According to the embodiment, the electrodes 32 and 34 are formed with semiconductor material such as poly silicon by a chemical vapor deposition method or sputtering or may be formed with other materials such as metals.

A conductive member 36 such as a drain electrode is formed above the diffused region 26 between a pair of diffused regions 24 and 28. The conductive member 36 is electrically connected to the diffused region 26 via the contact portion. Conductive members 38 and 40 such as a source electrode are formed above a pair of diffused regions 24 and 28 adjacent to the diffused region 26. The conductive members 38 and 40 are electrically connected to the diffused regions 24 and 28 via the contact portion. The conductive members 38 and 40 are electrically connected each other and also connected to the other elements of the integrated circuit 12 as shown in FIG. 2. The conductive members 38 and 40 are made of a metal such as aluminum in the embodiment.

The switching element 20 is electrically isolated from other elements by the element isolation region 42. The element isolation region 42 may be formed by a local oxidation id silicon (LOCOS) method. A thick part of the insulation film 30 may be the element isolation region 42. Further, an insulation film 44 may be formed on the insulation member 30.

The switching element 20 turns an electrical connection between the conductive elements 36 and 38 on and off, in response to voltage applied to the gate electrode 32 and 34. Further, the element 20 turns an electrical connection between the conductive elements 36 and 40 on and off. The details of such function is well known as MOSFET function and omitted here.

The insulation member 50 is formed on the conductive members 36, 38 and 40. The insulation member 50 covers over the conductive members 36, 38 and 40. The conductive members 36, 38 and 40 contacts the lower surface of the insulation member 50. The insulation member 50 is made of an electrically insulating material.

A conductive member 52 is formed on the insulation member 50. The conductive members 52 contacts the upper surface of the insulation member 50. The conductive members 52 is made of a metal such as aluminum in the embodiment. The conductive member 52 is pulled out as shown in FIG. 2 and electrically connected to the other elements of the integrated circuit 12. The configuration of pulling out the conductive member 52 is not limited to that shown in FIG. 2, but may be a small rectangular shape such as the conductive member 36 in FIG. 2, or may include a part of the configuration of pulling out the conductive member 36.

The conductive member 52 is electrically connected to the conductive member 36 via the contact portion penetrating the insulation member 50. The conductive member 52 overlaps the conductive member 36. The conductive member 52 is electrically disconnected from the conductive member 38 and 40. Electrical disconnection is preformed by the switching element 20. The conductive member 52 does not overlap the conductive members 38 and 40.

The semiconductor device includes a multi-layered member including a plurality of conductive members such as the conductive members 36, 38, 40, and 52 and others not shown in the figure, and a single or plural insulation member such as the insulation layer 50 and other insulation layers not shown in the figure.

A passivation film 54 covers over the conductive member 52 located as the top layer, except a part of it. The passivation film 54 may be one layer in the multi-layered member.

The external terminal 60 such as a bump is formed above and/or on the conductive member 52 at the exposed area from the passivation film 54. The conductive member 52 is the top layer of conductive members and the external terminal 60 is formed above and/or on the multi-layered member. The external terminal 60 is also formed on the passivation film 54.

Figure 3:
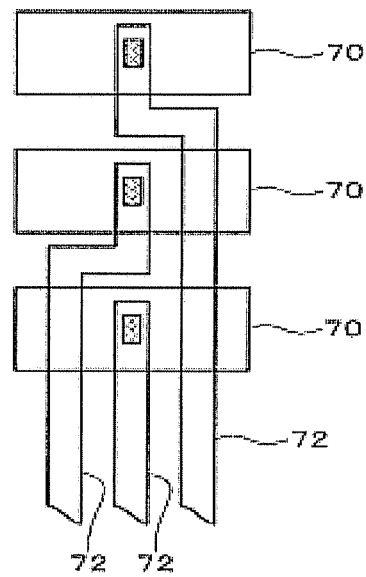
FIG. 3 shows an application of the above embodiment shown in FIGS. 1 and 2.

FIG. 3 shows an application of the above embodiment. FIG. 3 shows a plurality of conductive members 72 located as top layer of conductive members and an external terminal 70 connected to the conductive members 72. The plurality of conductive members 72 are electrically disconnected each other. Not only the conductive member 72 connected to the external terminal 70, but the other conductive member 72 connected to the other external terminal 70 are located directly under the external terminal 70 (a projected surface of the external terminal 70 to the multi-layered member). According to the aspect shown in FIGS. 1 and 2, electrical contact (exposed portion of the passivation film 54) of the conductive member 52 with the external terminal 60 is small comparing with a projected surface of the external terminal 60 to the multi-layered member. Hence, conductive member electrically connected to other elements can be formed by using application in FIG. 3 directly under the external terminal 60 (a projected surface to a multi-layered member.) As modification, the conductive member 72 located under the plurality (three layers for example) of external terminals 70 may be a conductive layer except a top layer of conductive members or combination of the top layer and a conductive layer except a top layer.

According to the embodiment, a pair of conductive members such as a combination of the conductive member 36 with 52 or other combination not shown in the figure contacts the upper surface and the lower surface of one insulation member such as the insulation member 50 directly under the external terminal 60 (a projected surface of the external terminal toward the multi-layered member). The conductive members are overlapped directly under the external terminal 60 and electrically connected each other. If insulating capability of the insulation member 50 is deteriorated, the overlapped portion is more electrically conductive than the non overlapped portion. However, there is no substantial problem even if overlapped portions of a pair of conductive members 36 and 52 are electrically conducted since they were originally conducted.

According to the embodiment, a pair of conductive members such as a combination of the conductive member 38 with 52, a combination of the conductive member 40 with 52 or other combination not shown in the figure contacts the upper surface and the lower surface of one insulation member such as the insulation member 50 directly under the external terminal 60 and electrically disconnected. The all conductive members are not overlapped directly under the external terminal 60. If insulating capability of the insulation member 50 is deteriorated, the non-overlapped portion is less electrically conductive than the overlapped portion. Therefore, a pair of the conductive member 38 with 52, or a pair of the conductive member 40 with 52 electrically disconnected become less conductive.

In the specification, a conductive member means not only a narrow definition comprising only a conductive material such as a metal, but also a broader definition comprising a non conductive material that can pass electrical current such as a semiconductor and a member formed for passing electrical current (the electrode 32 and 34 for example), For example, if one of electrodes 32 and 34 is combined with one of conductive members 36, 28 and 40 as a pair of members, this pair is also one of the above defined pair of conductive members.

In the embodiment, a part of the switching element 20 or all portions of it are located directly under the external terminal 60, namely a projected surface of the external terminal 60 toward a multi-layered member.

Figure 4:
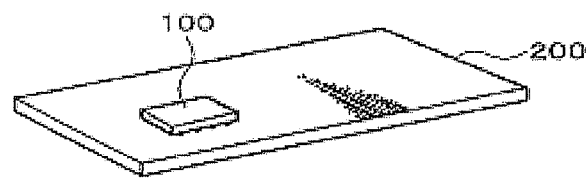
FIG. 4 shows a circuit board in which a semiconductor device of the embodiment is mounted.

FIG. 4 shows a circuit board 200 in which the semiconductor device of the embodiment of the invention, if the semiconductor substrate 10 is a semiconductor chip, is mounted. The semiconductor substrate is mounted by flip chip bonding, for example and wiring pattern not shown in FIG. 2 is formed on the circuit board 200.

FIG. 5 shows a semiconductor package including the semiconductor device 100 of the embodiment when the semiconductor substrate 10 is a semiconductor chip and a substrate 300 such as a ceramic substrate or a flexible substrate on which the device is mounted by face-down bonding for example. The semiconductor package is mounted on the circuit board 400.

Figure 6:
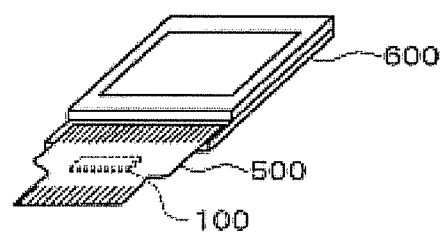
FIG. 6 shows an electronic module including a substrate in which a semiconductor device of the embodiment is mounted and an electronic panel in which the substrate is mounted.

FIG. 6 shows an electronic module including a substrate 500 in which the semiconductor device 100 of the present embodiment is mounted when the semiconductor substrate 10 is a semiconductor chip, and an electronic module 600 such as a liquid crystal panel or an electro luminescent panel in which the substrate 500 is mounted. The semiconductor device 100 and the substrate 500 comprise a tape carrier package (TCP).

Figure 7:
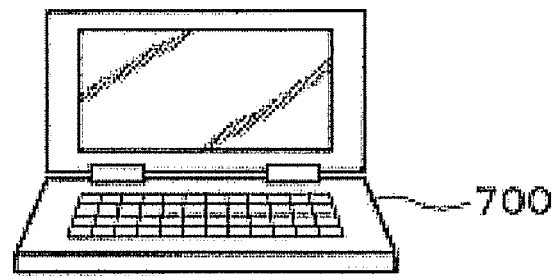
FIG. 7 shows electronic equipment having a semiconductor device of the embodiment.
Figure 8:
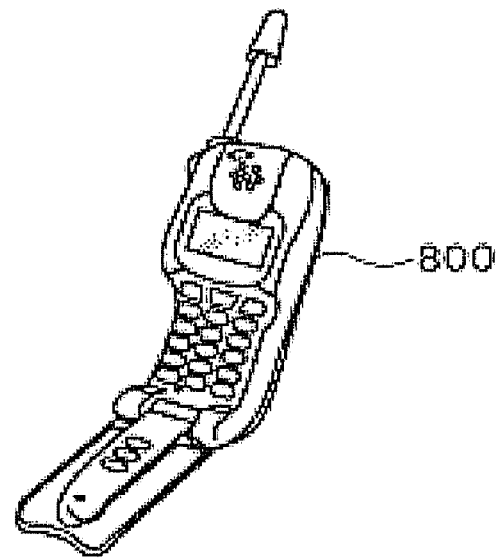
FIG. 8 shows electronic equipment having a semiconductor device of the embodiment.

As electronic equipment having the semiconductor device of the present embodiment, FIG. 7 shows a note type personal computer 700 and FIG. 8 shows a cellar phone 800.

It should be noted that the present invention is not limited to the above-mentioned embodiments, and various changes and modifications can be made within the spirit and scope of the invention. For example, the present invention includes substantially the same structure (including the structure with the same functions, methods, and results and the structure with the same goals and results) as the structure of the above-mentioned embodiments. The present invention also includes other structures in which non-essential elements of the above-mentioned embodiments are substituted. The present invention also includes the structures that can achieve the same effects or the same goals as those achieved by the above-mentioned embodiments. Moreover, the present invention includes other structures in which known methods and techniques are incorporated into the above-mentioned embodiments. Moreover, the present invention includes structures, which are limitedly excluded from any of technical items explained in the above embodiments. Moreover, the present invention includes structures in which any of well-known technology are limitedly excluded from the above mentioned embodiments.

What is claimed is:

1. A semiconductor device comprising:
a semiconductor substrate;
a first source region formed in the semiconductor substrate;
a drain region formed in the semiconductor substrate;
a first insulation member formed above the semiconductor substrate;
a first conductive member formed on a first surface of the first insulation member;
a second conductive member formed on a second surface of the first insulation member, the second surface opposite the first surface, the second conducting member being electrically disconnected from the first conducting member;
a passivation film having an opening formed above the second conductive member;
a first external terminal formed on the passivation film, the first external terminal being electrically connected to the second conductive member through the opening;
a second external terminal formed on the passivation film, wherein all portions of the first source region and all portions of the drain region are located under the first external terminal, the first conductive member and the second conductive member do not overlap each other under the first and second external terminals, and a portion of the second conductive member is located under the second external terminal;
a third external terminal;
a third conductive member that is connected to the second external terminal at a second connection point; and
a fourth conductive member that is connected to the third external terminal at a third connection point,
wherein the second conductive member is connected to the first external terminal at a first connection point,
the first connection point, the second connection point, and the third connection point being aligned in a first direction.

2. A semiconductor device according to claim 1, wherein the first conductive member is one of a source electrode and a drain electrode of a MOSFET under the first external terminal.

3. A semiconductor device according to claim 1, wherein the first external terminal includes a bump electrode.

4. A semiconductor device according to claim 1, wherein the second conductive member is a wiring layer under the first external terminal.

5. A semiconductor device according to claim 1, a portion of an outer edge of the first external terminal being located above the first conductive member.

6. A semiconductor device according to claim 1, a second source region being formed in the substrate, wherein all portions of the second source region are located under the first external terminal.

7. A semiconductor device according to claim 1, wherein at least one of the first, second, and third external terminals include an offset portion not aligned with the connection points in the first direction.

* * * * *